United States Patent [19]
Priddy

[11] Patent Number: 4,933,592
[45] Date of Patent: Jun. 12, 1990

[54] MIRROR TRANSDUCER CONTROL CIRCUIT

[76] Inventor: Lloyd W. Priddy, 1475 Hallam, Mahtomedi, Minn. 55115

[21] Appl. No.: 331,565

[22] Filed: Mar. 30, 1989

[51] Int. Cl.⁵ ............................................. H01L 41/08
[52] U.S. Cl. .................................... 310/332; 310/317; 310/330; 356/350
[58] Field of Search ................................ 310/330–332, 310/316, 317; 356/250; 250/487, 632; 372/94, 99, 107

[56] References Cited

U.S. PATENT DOCUMENTS

| | | | |
|---|---|---|---|
| 4,113,387 | 9/1978 | Shutt ............................... | 310/332 X |
| 4,383,763 | 5/1983 | Hutchings et al. .............. | 310/332 X |
| 4,488,080 | 12/1984 | Baumann ............................ | 310/328 |
| 4,533,849 | 8/1985 | Schnell ............................ | 310/331 X |
| 4,538,087 | 8/1985 | Germano et al. ................ | 310/331 X |
| 4,836,677 | 6/1989 | Doran et al. ..................... | 310/328 X |

FOREIGN PATENT DOCUMENTS 0241375 12/1986 Fed. Rep. of Germany ...... 310/332

Primary Examiner—Mark O. Budd
Attorney, Agent, or Firm—Robert A. Pajak

[57] ABSTRACT

A drive assembly and control circuit for a mirror assembly. Two piezoelectric discs are mounted on a diaphragm which is centrally connected to the mirror to move it. The drive circuit includes a source and first and second control means responsive to first and second control input signals to change the potential across the piezoelectric discs.

14 Claims, 3 Drawing Sheets

MIRROR TRANSDUCER CONTROL CIRCUIT

BACKGROUND OF THE INVENTION

The present invention relates to a mirror transducer control circuit for ring laser gyros. More, particularly, the present invention relates to a piezoelectric drive circuit for such transducers.

Ring laser gyros require that laser path length be maintained substantially constant. This is so since the laser beam intensity is dependent upon the path length. Variations in the beam intensity can adversely affect the performance parameters of the gyro, i.e., gyro errors. In order to maintain the ring laser path length constant, a mirror transducer is commonly employed.

Path length control in ring laser gyros has generally been provided by a variety of piezoelectric transducer assemblies. Such assemblies include one or more piezoelectric elements. Examples of piezoelectric transducer assemblies used in ring laser gyro applications are illustrated in U.S. Pat. No. 3,581,227 issued to Podgorski, U.S. Pat. No. 4,383,763 issued to Hutchings et al., U.S. Pat. No. 4,691,323 issued to Ljung, et al., and U.S. Pat. No. 4,488,080 issued to Baumann.

Ljung et al., and Hutching et al. teach the use of a double diaphragm mirror assembly which includes a piezoelectric driver assembly. The mirror assembly includes a central post which is coupled to a driver assembly. The driver assembly is a cup-shaped metallic driver fixture having an annular diaphragm extending between an integral central member and outer rim member. The central member is rigidly coupled to or attached to the central post of the mirror assembly. A pair of symmetrical piezoelectric annular disks are positioned on opposite sides of the annular diaphragm to provide transducer action.

BRIEF DESCRIPTION OF THE INVENTION

An object of the present invention is to provide a piezoelectric driver circuit for a driver assembly having a pair of piezoelectric elements on opposite sides of a transducer driver diaphragm.

An object of the present invention is to provide a mirror transducer having a driver assembly with a pair of piezoelectric elements on opposite sides of a transducer diaphragm and with the polarization axes of said piezoelectric elements pointing in opposite directions.

In the present invention, a mirror transducer assembly is comprised of a mirror assembly and a driver assembly. Both the mirror assembly and the driver assembly include a diaphragm portion surrounding an integral central member. The central members are rigidly coupled together to provide tandem translation movement along a central axis passing through the central members. A pair of piezoelectric disks are positioned on opposite sides of the diaphragm portion of the driver assembly with their polarization axes pointing in an opposite sense, and in which said piezoelectric elements are operated with a singular polarity electric potential.

DETAILED DESCRIPTION OF THE DRAWINGS

DETAILED DESCRIPTION OF THE INVENTION

Figure 1:
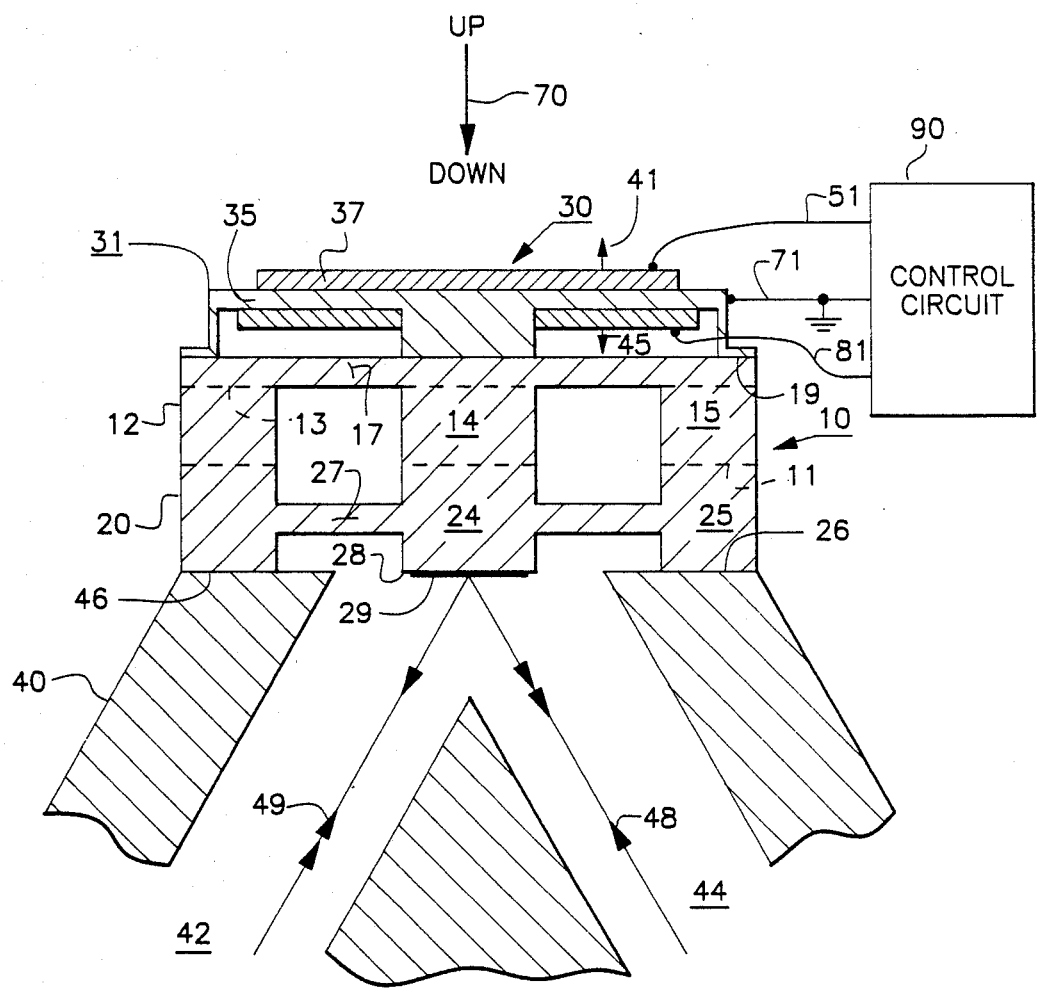
FIG. 1 shows a cross-section diagram of a mirror transducer assembly, mounted to a ring laser block.

FIG. 1 illustrates a double diaphragm mirror transducer assembly utilizing the principles of U.S. Pat. No. 3,581,227 and the particular double diaphragm structure illustrated in aforementioned U.S. Pat. Nos. 4,383,763, 4,691,323, and U.S. Pat. No. 4,488,080.

The mirror transducer is comprised of a mirror assembly 10 and driver assembly 30. The mirror assembly is cylindrically shaped and includes a top half 12 and a bottom half 20 being E-shaped in cross section. Top half 12 includes a central post member 14, an outer rim member 15 and a thin annular diaphragm member 17 extending radially between central post member 14 and outer rim member 15. Similarly, bottom half 20 includes a central post member 24 and outer rim member 25 and a thin annular diaphragm member 27 extending between central member 24 and outer rim member 25. Outer rim member 25 includes a mounting surface 26. Further, central post member 24 includes an external surface 28 having either a mirror or reflective means 29, generally being a multilayer dielectric mirror.

Mirror assembly 10 may be constructed in a variety of ways to achieve the intended purpose. For example, mirror assembly 10 may be comprised of two individual E-shape piece parts for top half 12 and bottom half 20 and joined at their interface 11 as illustrated in FIG. 1. Alternatively, a cylindrical block may be provided with top and bottom annular groves 26a and 26b to form diaphragm 27; and the second diaphragm 17 is provided by a disk joined to the cylindrical block at surface 13 to create the double diaphragm. Another embodiment of mirror assembly 10 may be a single block which is bored to provide the double diaphragm members 17 and 27 as substantially illustrated.

Mirror assembly 10 is shown rigidly fixed to a corner of a ring laser block 40 having a pair of interconnecting tunnels 42 and 44. Laser block 40 generally includes a mounting surface 46 which is fixed to surface 26 of outer rim member 25 for providing a generally gas tight seal therebetween.

Mirror assembly 10 is positioned on laser block 40 such that laser beams 48 and 49 can reflect off of mirror 29 in a well known manner.

Driver assembly 30 is comprised of a generally cup-shaped driver fixture 31 including a central post member 32, an outer rim member 34, and an annular diaphragm member 35 extending between and integral with central post member 32 and outer rim member 34. Extending from outer rim member 34 is a mounting flange 36 which is secured to mirror assembly outer rim member 15 at surface 19 thereof. Further, central post member 32 is fixed to central post member 14 at surface 19 thereof.

Button-shaped piezoelectric disk 37 and annular piezoelectric disk 38 are fixed to opposite sides of diaphragm member 35. Disk 38 surrounds protruding extension member 33 of central post member 32. The polarization vectors of piezoelectric disks 37 and 38 are arranged to be in an opposite sense as particularly illustrated by arrows 41 and 45, respectively. In the preferred embodiment of the invention, the polarization vectors of piezoelectric disks 37 and 38 are pointing in an opposite direction. (An alternative design would have the polarization vector pointing toward diaphragm 35.) In FIG. 1, the polarization vectors are pointing away from driver fixture 31.

In the following exposition, the following conventions should be noted. A positive potential connected at the polarization vector arrow head side of the piezoelectric disk relative to the opposite side thereof will cause the disk to expand in a direction in parallel with the arrow and contract along a direction transverse to the arrow.

In one embodiment of the invention, driver fixture 31 is electrically conductive and electrically connected in common to one side of disks 37 and 38 through an electrically conductive adhesive (not shown). As further illustrated in the drawing, disks 37 and 38, and driver fixture 31 are electrically connected to control circuit 90 which is diagrammatically illustrated in FIG. 2.

Figure 2:
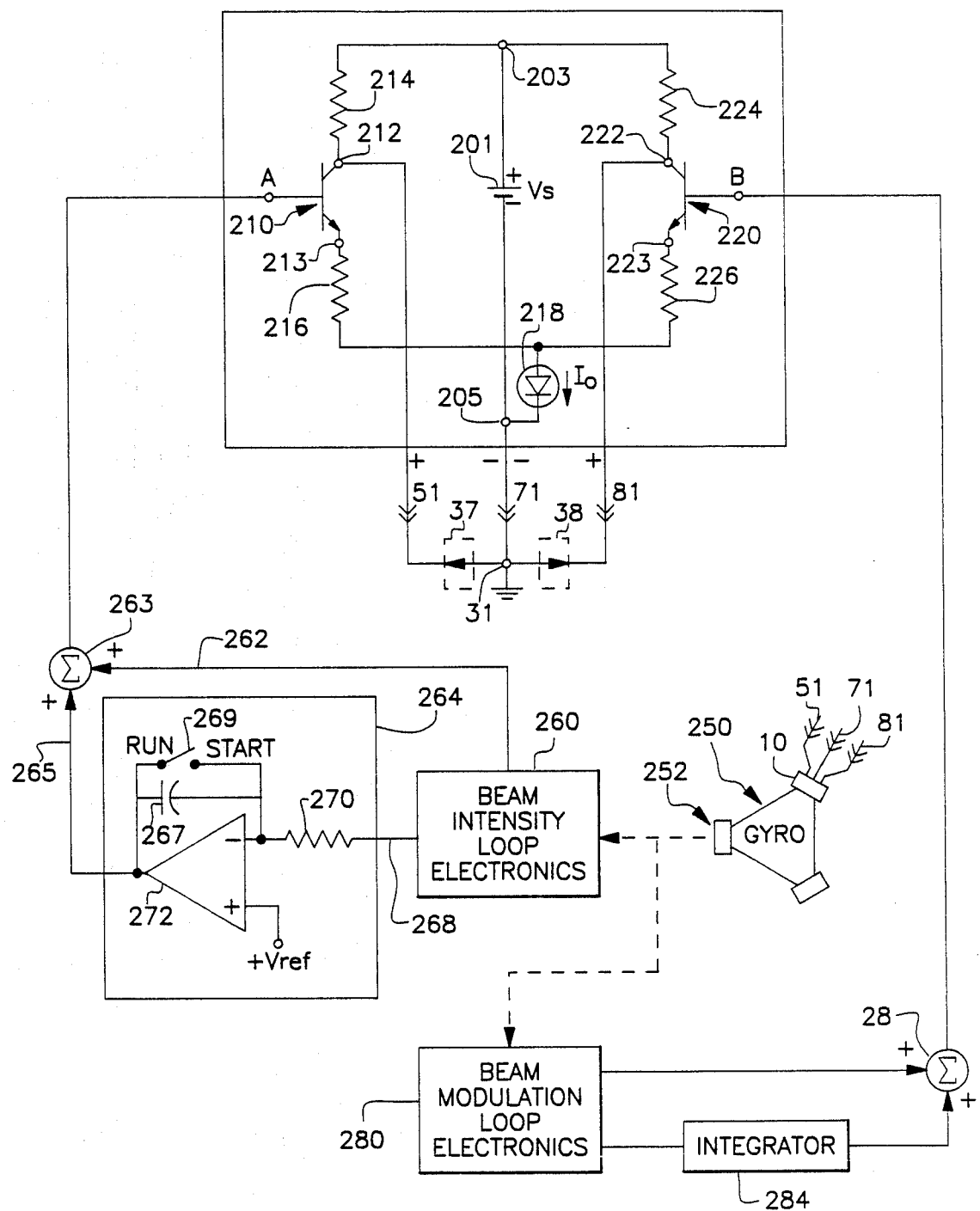
FIG. 2 illustrates one embodiment of a control circuit in accordance with the present invention for the mirror transducer of FIG. 1.

Referring to FIGS. 1 and 2, the upper surface of disk 37 is electrically connected to control circuit 90 through lead 51; the lower surface of disk 38 is electrically connected to control circuit 90 through lead 81; and driver fixture 3 and the adjacent sides of disks 37 and 38 are electrically connected to control circuit 90 through lead 71 and at the same time connected in common to an electrical ground.

A PZT driver control circuit in accordance with the present invention is illustrated in FIG. 2. Referring to FIG. 2, control inputs A and B are shown responsive to ring laser gyro beam intensity signals as will be subsequently described.

Control circuit 90 includes electric potential source 201 having a positive polarity terminating means 203 and a more negative polarity terminating means 205. A first control means is provided by transistor 210 which includes an input terminating means A and first and second output terminating means 212 and 213, respectively. First output means 212 is electrically connected to lead 51 of piezoelectric disk 37. As illustrated in FIG. 2, the output terminating means 212 is a transistor collector electrically connected to terminating means 203 through impedance means 214. The emitter of transistor 210 serves as the second output terminating means 213, and is electrically connected to terminating means 205 through impedance means 216 and circuit means 218.

In a similar manner, a second control means is provided by transistor 220 which includes an input terminating means B and first and second output terminating means 222 and 223. Second output means 222 is electrically connected to lead 81 of piezoelectric disk 38. Like the first control transistor, the output terminating means 222 is a transistor collector electrically connected to terminating means 203 through impedance means 224. The emitter of transistor 220 serves as the second output terminating means thereof, and is electrically connected to terminating means 205 through impedance means 226 and circuit means 218.

It should be recognized by those skilled in the art that the control circuit as particularly illustrated in FIG. 2 is essentially a differential amplifier having feedback coupling between the two control means 210 and 220 provided by circuit means 218. Circuit means 218 therefore is selected to provided the intended absence or presence of coupling between the two control transistors 210 and and 220.

Circuit means 218 is illustrated in FIG. 2 as a constant current rectifier which serves as a constant current source. An example of a constant current rectifier is Motorola Part No. 1N5298 which is a field-effect regulator diode (nominally 1.1 ma). By virtue of its circuit position, it provides coupling between the two transistors 210 and 220. As will be more particularly described, circuit means 218 may alternatively may be a selected impedance to provide a selected amount of coupling.

The control means provided by transistors 210 or 220 are responsive to input signals presented to input means A and B. Only the control operation of control transistor 210 will be described since control transistor 220 operates in a similar manner. With no input signal presented to input means A, transistor 210 is off and the potential across piezoelectric disk 37 is substantially the electric potential source $V_S$. In contrast, with a sufficiently large signal at input means A to saturate transistor 210, and where impedance means 214 is much larger than impedance means 216, the electric potential across piezoelectric disk 37 approaches zero.

Circuit elements 214, 216, 224, and 226, and additional biasing arrangements, if any, (not shown) are selected such that when circuit means 218 functions as a constant current source, transistor 220 will turn more off as transistor 210 is turned more on. In this situation, as transistor 210 is turned more on in response to the control signal at input A, transistor 210 is turned more off. In response, piezoelectric disk 37 will contract radially while piezoelectric disk 38 will expand radially. This will result in flexure of driver fixture 31 to alter the position of mirror 29 along an axis perpendicular thereto.

With the circuit arrangement as just described, the transducer action of the mirror is provided by only applying a single polarity electric potential across both piezoelectric elements having a variable magnitude in response to the control input signal.

The control signals for presentation to input means A and B will now be described with reference also to FIG. 2. A ring laser gyro is illustrated in FIG. 2 by numeral 250. Gyro 250 includes a readout means 252 for providing an output portion of the counter-propagating beams within ring laser gyro 250 for subsequent signal processing and general detection by a photodetector. Gyro 250 is also shown including the piezoelectric mirror transducer 10, e.g., an embodiment similar to that shown in FIG. 1. Beam intensity loop electronics 260 generally provides a modulation signal on lead 262 which is summed by summing means 263 with the output of integrator 264 on lead 265. Integrator 264 is illustrated being comprised of a amplifier 272 having a reference voltage at its positive input and a feedback capacitor 267 between the amplifier output and its negative input in a well known manner. The output of beam intensity loop electronics 260 provides an output signal on signal line 268 representative of the peak intensity of at least one of the counter-propagating laser beams of gyro 250.

Integrator 264 includes a switch 269 for shunting, at start up, capacitor 267. Accordingly, at start up piezoelectric disk 37 will initially contract in a radial direction. After start up switch 269 is opened, i.e., the run condition. During the run condition, output means 212 will operate at approximately one half the electric potential source $V_S$. In the run condition, the combination of beam intensity loop electronics 260 and integrator 264 will operate the piezoelectric disk 37 such as to provide path length control for ring laser gyro 250.

At the same time, control means 220 receives a control input signal into input terminating means B in response to the beam modulation loop electronics 280. The output terminating means 222 responds to the input signal at the B input terminating means similar to transistor 210 as already described.

The combination of beam modulation loop electronics, summing means 283, and integrator 284, as well as the path length control described above, is similar to that show in U.S. Pat. No. 4,150,071 entitled "Control Apparatus", issued to Podgorski.

In accordance with the present invention as particularly described in FIGS. 1 and 2, piezoelectric driver fixture 31 is provided with a pair of piezoelectric elements in which the polarization vectors are perpendicular to the disk radial direction, and are pointing in an opposite sense. The PZT driver circuit in accordance with the present invention provides a single polarity electric potential across the piezoelectric elements thus avoiding depolarization, i.e., operating the PZT with an electric potential of both polarities. Further, the PZT driver circuit, in accordance with the present invention allows for push-pull control of piezoelectric disks 37 and 38 while operating such disks with an electric potential of a single polarity.

Alternatively, it should be recognized by those skilled in the art, that if circuit means 218 is a low impedance (voltage source or electrically shorted) there will be virtually no coupling between the two transistors. In this situation, transistors 210 and 220 can be independently operated via input means A and B, respectively. That is, transistor 210 can control the position of mirror 29 through control of piezoelectric disk 37, while at the same time transistor 220 can control the position of mirror 29 through control of piezoelectric disk 38. If circuit means 218 is a voltage source, the latter source can be used for biasing the amplifier.

Figure 3:
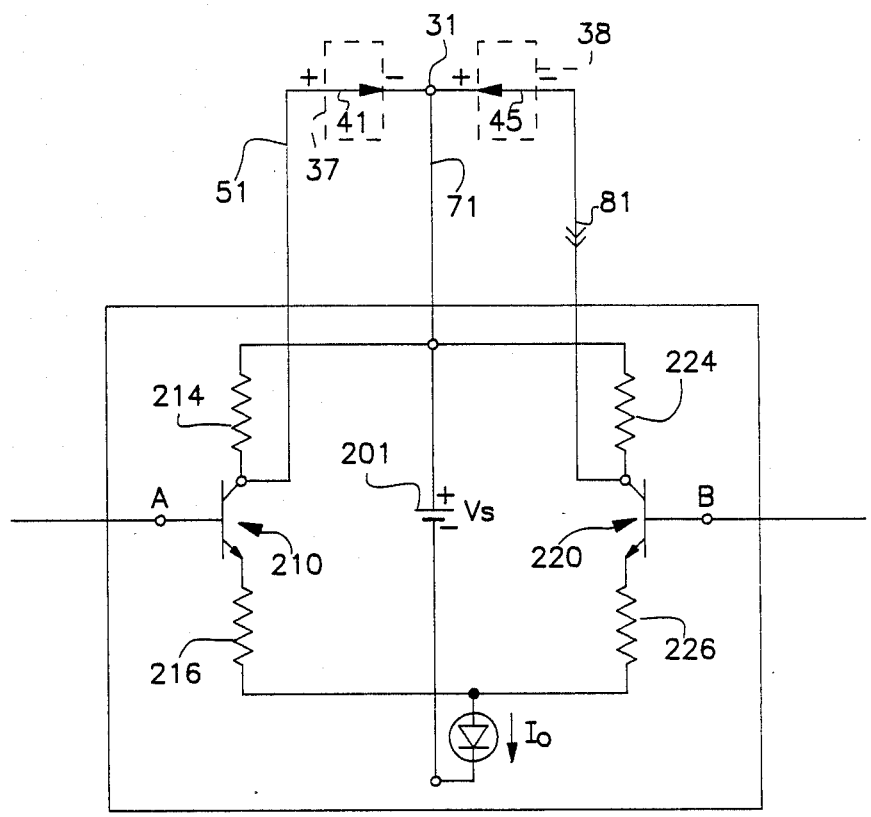
FIG. 3 shows an alternative transducer control circuit in accordance with present invention.

FIG. 3 and 4 illustrate alternative embodiments of the invention in accordance with principles described above. Specifically FIG. 3 illustrates control circuit 90 in which the piezoelectric elements have polarization vectors 41 and 45 pointing in an opposite direction as illustrated in FIG. 2. As illustrated in FIG. 3 terminating means 203 is electrically connected to ground as opposed to terminating means 205 in FIG. 2.

It should be recognized by those skilled in the electronic arts that the differential amplifier provided by control transistors 210 and 220 may be provided by a wide variety of circuits to provide the intended function. Specifically, the npn transistors may be alternatively provided by pnp transistors; as well as a wide variety of electronic amplifiers and switches.

It should be noted that all of the above cited patents and publications are herein incorporated by reference.

While only preferred embodiments of the invention have been shown and described, it is intended that this invention be interpreted as contemplating any variations which are within the true spirit and scope of the invention. Particularly, the transducer assembly is applicable to any optical device, but particularly to lasers and ring lasers.

The embodiments of an invention in which an exclusive property or right is claimed are defined as follows:

1. A mirror transducer system comprising:
   a mirror assembly having
      a central member having first and second opposite ends, and
      said first end including means for reflecting electromagnetic waves;
   a driver assembly including
      a central member having first and second opposite ends,
      an outer rim member,
      a flexible annular diaphragm between and integral with said central member and said outer rim member, and
      first and second piezoelectric disks having a first side thereof rigidly fixed to opposite sides, respectively, of at least a portion of said flexible annular diaphragm, and in which said disks are mounted to said diaphragm with their respective polarization vector being perpendicular to the radial direction of the disk and in an opposite sense relative to each other, and wherein said first side of said first and second disks are electrically in common;
   means for coupling said central member of said driver assembly to said central member of said mirror assembly; and
   a driver circuit including,
      an electrical potential source having first and second opposite polarity termination means, said first polarity termination means being electrically connected to said first sides of said first and second piezoelectric disks,
      a first control means having a first control input terminating means, and a first output terminating means electrically connected to a second side of said first piezoelectric disk, opposite said first side thereof,
      a second control means having a second control input terminating means, and a first output terminating means electrically connected to a second side of said second piezoelectric disk, opposite said first side thereof,
      said first control means being operative, in response to a first control input signal presented to said first control input terminating means, to vary the electric potential between substantially zero and a magnitude related to said electric potential of said source, and in which the electrical potential across said first piezoelectric disk is of a first polarity from said first side relative to said second side of said first piezoelectric disk, and
      said second control means being operative, in response to a second control input signal presented to said second control input terminating means, to vary the electric potential between substantially zero and a magnitude related to said electric potential of said source, and in which the electrical potential across said second piezoelectric disk is of said first polarity from said first side relative to said second side of said second piezoelectric disk.

2. The apparatus of claim 1 wherein said driver assembly diaphragm is electrically in common with said first sides of said first and second piezoelectric disks.

3. The apparatus of claim 1 wherein:
   each of said first and second control means includes a second output terminating means; and
   said driver circuit further includes a circuit coupling means having a first terminating means electrically connected to said first sides of said piezoelectric disks, and having a second terminating means electrically connected to said second output terminating means of each of said first and second control means.

4. The apparatus of claim 3 wherein said circuit coupling means serves as a constant current regulator for regulating the current into and out of said first terminating means.

5. The apparatus of claim 3 wherein said circuit coupling means is a low impedance.

6. A mirror transducer comprising:
a mirror for reflecting electromagnetic waves;
a driver fixture having a flexible annular diaphragm, said driver fixture coupled to said mirror for coupling flexure of said annular diaphragm area to said mirror;
first and second piezoelectric disks having a first side thereof rigidly fixed to opposite sides, respectively, of at least a portion of said flexible annular diaphragm area, and therein said first side of said first and second disks are electrically in common and in which said piezoelectric disks are mounted to said diaphragm with their respective polarization vector being perpendicular to the radial direction of the disk and in an opposite sense relative to each other; and
a driver circuit including,
a first control means having a first control input terminating means, a first output terminating means electrically connected to a second side of said first piezoelectric disk, opposite said first side thereof, and a second output terminating means having an electrical current passing therethrough in relation to any electrical current passing through said first output terminating means, and
a second control means having a second control input terminating means, a third output terminating means electrically connected to a second side of said second piezoelectric disk, opposite said first side thereof, and a fourth output terminating means having an electrical current passing therethrough in relation to any electrical current passing through said third output terminating means, and
a circuit coupling means having a first terminating means electrically connected to said second and fourth output terminating means of said first and second control means, and having a second terminating means electrically connected to said first sides of said piezoelectric disks;
said first control means being operative, in response to a first control input signal presented to said first control input terminating means, to vary the electric potential across said first piezoelectric disk with a first constant polarity from said first side relative to said second side of said first piezoelectric disk, and
said second control means being operative, in response to a control input signal presented to said second control input terminating means, to vary the electrical potential across said second piezoelectric disk with said first constant polarity from said first side relative to said second side of said second piezoelectric disk.

7. The apparatus of claim 6 wherein said driver fixture diaphragm is electrically in common with said first sides of said first and second piezoelectric disks.

8. The apparatus of claim 6 wherein said circuit coupling means serves as a constant current regulator for regulating the current through said circuit coupling means second terminating means.

9. The apparatus of claim 6 wherein said circuit coupling means is a low impedance.

10. The apparatus of claim 6 wherein said first control means comprises at least one transistor having its base electrically connected to said first input terminating means, and said transistor operative for controlling electrical currents passing into and out of said first and second output terminating means.

11. The apparatus of claim 6 wherein said first and second control means each comprises at least one transistor.

12. The apparatus of claim 6 further comprising an electrical potential source having first and second opposite polarity termination means, said first polarity termination means being electrically connected to said first sides of said first and second piezoelectric disks, and said second polarity termination means electrically connected to a power source input means of said first and second control means.

13. A electrical-mechanical control circuit for controlling a pair of piezoelectric elements positioned on opposite sides of a driver fixture having a flexure diaphragm, said control circuit comprising:
first and second piezoelectric disks having a first side thereof rigidly fixed to opposite sides of at least a portion of said flexible diaphragm area respectively, and wherein said first side of said first and second disks are electrically in common, and in which said piezoelectric disks are mounted to said diaphragm with their respective polarization vector being perpendicular to the radial direction of the disk and in an opposite sense relative to each other; and
a first control means having a first control input terminating means, a first output terminating means electrically connected to a second side of said first piezoelectric disk, opposite said first side thereof, and a second output terminating means having an electrical current passing therethrough in relation to any electrical current passing through said first output terminating means, and
a second control means having a second control input terminating means, a third output terminating means electrically connected to a second side of said second piezoelectric disk, opposite said first side thereof, and a fourth output terminating means having an electrical current passing therethrough in relation to any electrical current passing through said third output terminating means, and
a circuit coupling means having a first terminating means electrically connected to said second and fourth output terminating means, and having a second terminating means electrically connected to said first sides of said piezoelectric disks; and
said first control means being operative, in response to a control input signal presented to said first control input terminating means, to vary the electric potential across said first piezoelectric disk with a first constant polarity from said first side relative to said second side of said first piezoelectric disk, and
said second control means being operative, in response to a control input signal presented to said second control input terminating means, to vary the electric potential across said second piezoelectric disk with said first constant polarity from said first first side relative to said second side of said second piezoelectric disk.

14. The apparatus of claim 13 further an electrical potential source having first and second opposite polarity termination means, said first polarity termination means being electrically connected to said first sides of said first and second piezoelectric disks, and said second polarity termination means electrically connected to a power source input means of said first and second control means.

* * * * *